(12) United States Patent
Merritt

(10) Patent No.: US 6,791,359 B1
(45) Date of Patent: Sep. 14, 2004

(54) ELECTRONIC STRUCTURE FOR PASSING SIGNALS ACROSS VOLTAGE DIFFERENCES

(75) Inventor: Lauren Vail Merritt, Cupertino, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/290,199

(22) Filed: Nov. 8, 2002

(51) Int. Cl.$^7$ .......................................... H03K 19/0175
(52) U.S. Cl. .......................................... 326/89; 326/90
(58) Field of Search ........................... 326/82, 83, 86, 326/89, 90, 115, 126

(56) References Cited

U.S. PATENT DOCUMENTS

| | | | | |
|---|---|---|---|---|
| 4,748,346 A | * | 5/1988 | Emori | ........................ 326/90 |
| 5,910,736 A | * | 6/1999 | Nagata et al. | ............... 326/126 |
| 6,091,266 A | * | 7/2000 | Pohlmann | .................... 326/126 |
| 6,104,232 A | * | 8/2000 | Filip | ........................... 327/513 |
| 6,628,220 B2 | * | 9/2003 | Cosand | ........................ 341/144 |

* cited by examiner

Primary Examiner—Don Le
(74) Attorney, Agent, or Firm—McDermott Will & Emery LLP

(57) ABSTRACT

An electronic structure for passing signals across voltage differences includes a signal bus segment that includes at least one circuit element. Circuitry connected to the signal bus segment is operatively connected to a voltage source. Signal bus segments and the associated circuitry can be stacked and connected to corresponding stacked voltage sources. This allows a signal to be passed to a particular circuit, regardless of the voltage difference between the source circuit and the desired circuit.

4 Claims, 2 Drawing Sheets

ELECTRONIC STRUCTURE FOR PASSING SIGNALS ACROSS VOLTAGE DIFFERENCES

BACKGROUND OF THE INVENTION

The present invention relates to data transmission circuits, and more particularly to circuits for passing signals across voltage differences. For example, to monitor the state of circuits operating at respective voltages, data exchanges with the circuits must account for the different operating voltages of the respective circuits. One example of an area that this issue presents itself in is monitoring the state of cells in a set of batteries. For example, the net terminal voltage of a set of batteries may be in the range of 15 v to 100 v. In such a case, there may be, for example, twenty-five batteries in the set. Obviously, the voltages at the individual cells increase toward the terminal voltage of the set. Accordingly, assessing the voltage of an individual cell must account for the voltage of that cell with in the set.

There are several ways to address the voltage differential issue. A first approach is to use a common mode rejection resistor network. The voltage of a cell can be monitored using a buffer amplifier and analog multiplexer together with an analog-to-digital converter. This approach, however, typically requires the use of a laser trimmed resistor network. This adds to the expense of the circuit, and requires additional manufacturing time and equipment. Also, for more than four or five cells, it is difficult to achieve the desired resistor network accuracy, even with laser trimming. Even if the desired accuracy could be achieved, the resistor network draws power from the cells. This drains the cells.

Another approach to monitoring the voltage of individual cells in the battery set is to use common mode rejection signal sampling transformers. These transformers can present selected measurements to a single analog-to-digital converter. The use of transformers increases the size, cost, and weight of the circuit.

A third approach to monitoring the voltage of individual cells in the battery set is to use individual analog-to-digital converters. The outputs of the analog-to-digital converters are multiplexed to provide the voltage of the desired cell. This approach has distinct advantages, one of which is compact analog-to-digital converters. The difficulty is, however, in implementing an acceptable multiplexing scheme to output the multiplexed signal.

There are variations on the third approach. One is to have the operational control of the analog-to-digital converters and the output multiplexing accomplished with a MIL-STD-1553 data bus. This data bus crosses voltage differentials through the use of transformers, which have the previously mentioned size, cost, and weight impacts. Another variation on the third approach is to have the operational control and the multiplexing implemented using opto-isolators. However, opto-isolators draw too much current and are not compatible with integration of a suitable circuit on an integrated circuit.

Another variation on the third approach is to use frequency signals applied through DC isolating capacitors for the purpose of operational control and multiplexing control. It is difficult, however, to make capacitors of substantial size internal to an integrated circuit. So, using capacitive isolation raises manufacturing costs in a manner similar to that encountered when using transformers. This approach adds complexity to the interface circuitry, and tends to cause electromagnetic interference. Avoiding such interference commonly requires bulky shielding, which complicates and increases the cost of packaging.

SUMMARY OF THE INVENTION

It is an object of the present invention to provide an inexpensive structure for passing signals across voltage differences.

It is another object of the present invention to provide a simple structure for passing signals across voltage differences.

It is a further object of the present invention to provide a structure for passing signals across voltage differences that can be fabricated as an integrated circuit.

It is still another object of the present invention to provide a structure for passing signals across voltage differences that does not rely on signal transformers.

DETAILED DESCRIPTION OF THE PREFERRED EMBODIMENTS

The present invention provides an improved circuit structure that allows signals to be passed across voltage differences. The following discusses the present invention with reference to an exemplary embodiment. The invention is not limited to application to battery cells. It can be applied to passing signals over any voltage difference, regardless of the source of the voltage difference.

Figure 1:
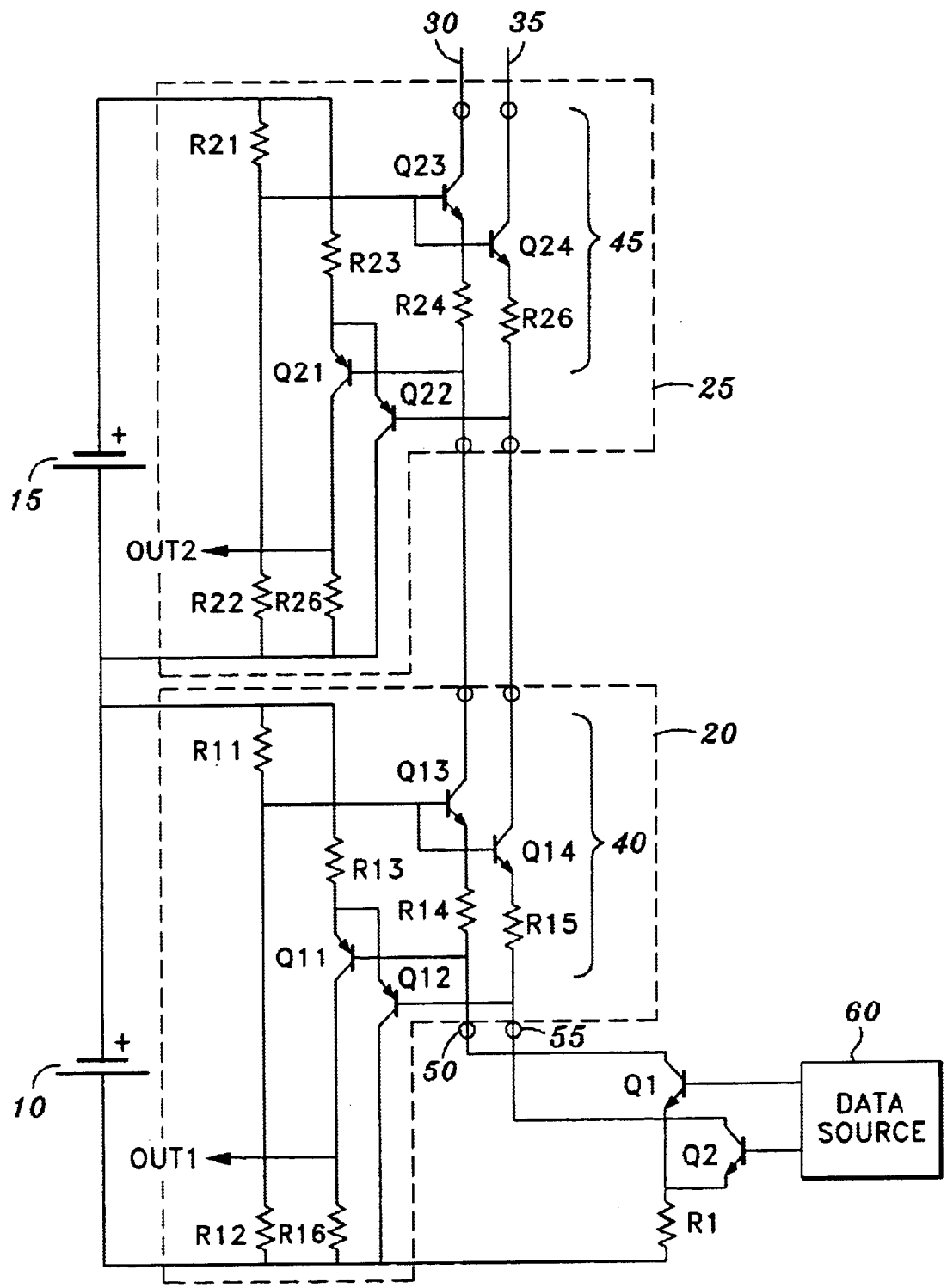
FIG. 1 is a schematic diagram of an exemplary embodiment of circuit capable of sending signals from a lower voltage to a higher voltage.

FIG. 1 is a schematic diagram of an exemplary embodiment of circuit capable of sending signals from a lower voltage to a higher voltage. FIG. 1 shows two voltage sources 10 and 15 connected in a stacked arrangement. The voltage sources 10 and 15 are respectively connected to circuits 20 and 25. Since, in the illustrated exemplary embodiment, circuits 20 and 25 are substantially similar, the following focuses primarily on the operation of circuit 20.

FIG. 1 schematically shows data bus lines 30 and 35 that are common to both circuits 20 and 25. If there are additional voltage sources, then the data bus lines 30 and 35 would be operatively coupled to the circuits associated with those additional voltage sources in addition to the circuits 20 and 25. As shown, the data bus lines are differential lines. This is merely illustrative. The data bus need not be differential and could be single ended. The selection of the type of data bus depends upon the design of a given application. For example, if the circuit was to operate in a noisy environment, then a differential data bus would be more desirable than, for example, a single ended data bus. However, those skilled in the art will readily recognize that other data bus structures, and/or circuit elements can be used to address the noise problem, In addition, FIG. 1 shows the data bus lines 30 and 35 directly connected between circuits 20 and 25. This is also merely illustrative. The data bus lines could be coupled to the circuits such as 20 and 25 via intermediate circuits and/or devices.

The data bus lines in circuits 20 and 25 respectively include data bus segments 40 and 45. As noted above, the data bus, and hence the data bus segments are shown as differential lines. This is only illustrative, the data bus segments could be signal ended, or any other signal lines suitable for an application. The data bus segment 40 includes circuit elements Q13, Q14, R14, and R15. The resistors R14 and R15 are respectively connected to receive a first signal at points 50 and 55. A differential pair of transistors Q1 and Q2 generates the first signal in responsive to a data source 60. In the illustrative differential data bus example shown in FIG. 1, the data source 60 provides a differential signal to transistors Q1 and Q2. For example, 5 v can be applied to Q1 and 0 v can be applied to Q2. This causes a current to flow in the data bus line 30 by driving transistor Q1 and load transistor Q13 to conduct. Transistors Q2 and Q14 are not conductive. Q1 and Q13 being conductive lowers the emitter voltage of Q11, causing it to turn on. This tends to pull the output signal, OUT1, toward the positive voltage of voltage source 10.

Alternatively, a differential signal of 0 v can be applied to Q1 and 5 v to Q2. In such case, a current flows in data bus line 35 by driving transistors Q2 and Q14 to conduct. Transistors Q1 and Q13 would not be conductive in such a case. And Q11 would in turn not be conductive. Q2 and Q14 being conductive causes the base of Q12 to be pulled toward the negative voltage of voltage source 10. As a result, the output signal, OUT1, is pulled toward the negative voltage of voltage source 10 through resistor R16. As seen from the above operation, the variations of the output signal, OUT1, are responsive to changes in the first signal received at points 50 and 55

In a similar manner, the output signal, OUT2, is also responsive to changes in the first signal received at points 50 and 55. However, when Q21 is conductive, the signal OUT2 is pulled toward the positive voltage of the voltage source 15. And when Q22 is conductive, the output signal, OUT2 is pulled toward the negative voltage of the voltage source 15. Thus, variation in the first signal at points 50 and 55 causes output signal, OUT2, to vary between the negative and positive output voltages of voltage source 15. The circuit elements in the data bus segment 40 allow the first signal at points 50 and 55 to be effectively applied to the circuit 25 as a current flow, which is sensed by transistors Q21 and Q22. In this illustrative embodiment, the first signal is passed across the voltage difference of voltage sources 10 and 15. And, the output signals, OUT1 and OUT2, respectively vary between the positive and negative voltages of their associated voltage source. Therefore, the output signals OUT1 and OUT2 can drive the circuitry respectively associated with the voltage sources 10 and 15 without the need for voltage translation/shifting circuitry.

As noted above, while differential data bus lines 30 and 35 are shown in the illustrative embodiment, a single data bus line could be used, or another suitable data bus depending upon the application. In addition, bipolar transistors are shown, but any suitable device, such as field effect transistors could be used. Alternatively, relays could be used in place of those transistors.

Figure 2:
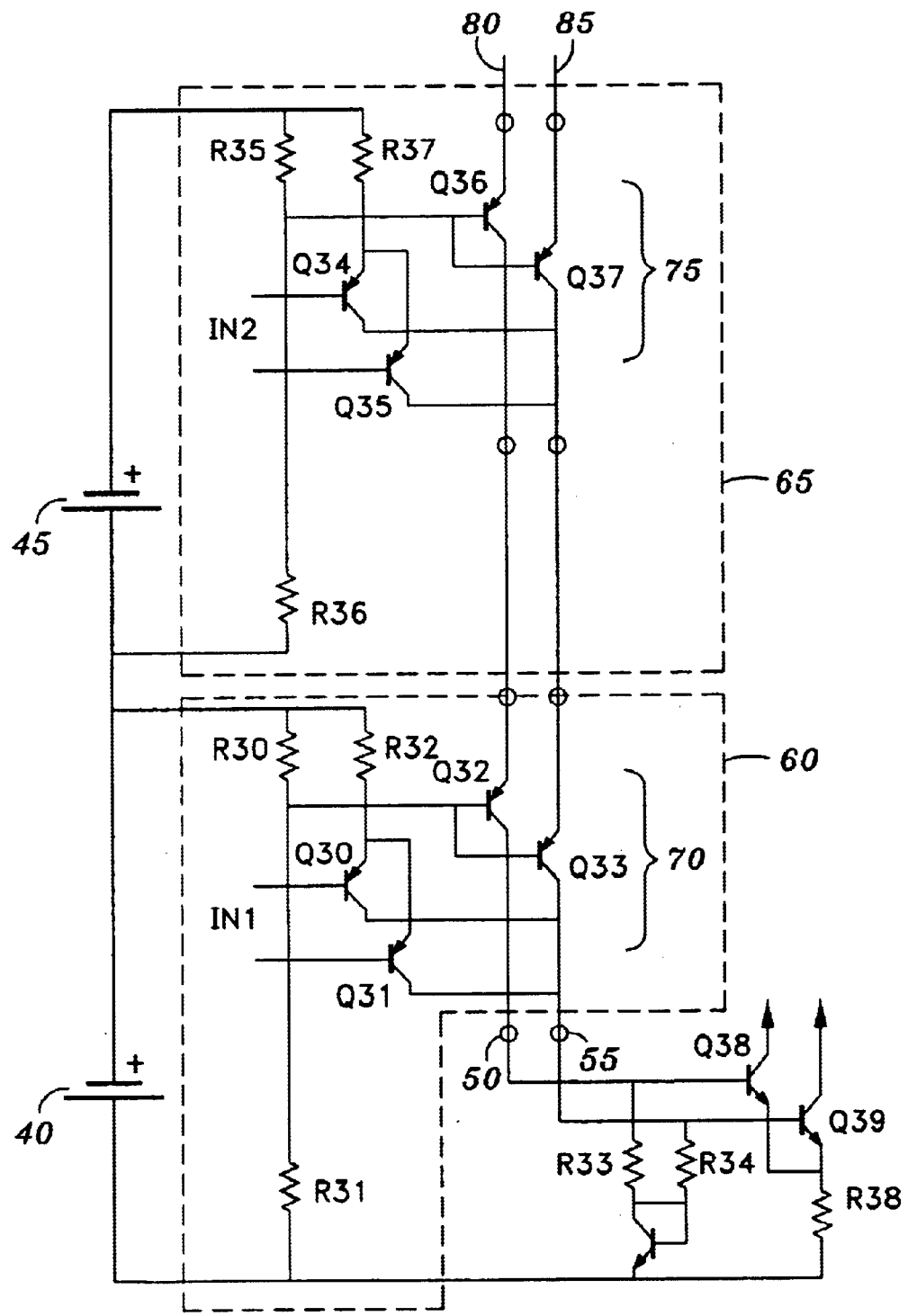
FIG. 2 is a schematic diagram of an exemplary embodiment of circuit capable of sending signals from a higher voltage to a lower voltage.

FIG. 2 is a schematic diagram of an exemplary embodiment of circuit capable of sending signals from a higher voltage to a lower voltage. FIG. 2 shows two voltage sources 40 and 45 in a stacked arrangement. While FIG. 2 labels the voltages sources differently than those shown in FIG. 1, the FIG. 2 voltage sources can be the same as those shown in FIG. 1. The voltage sources 40 and 45 are respectively connected to circuits 60 and 65. The circuit 60 can be included in an integrated circuit for the circuit 20, but also could be a separate integrated circuit. Similarly, the circuit 65 can be included in an integrated circuit for the circuit 25, but also could be a separate integrated circuit.

FIG. 2 schematically shows data bus lines 80 and 85 that are common to both circuits 60 and 65. As with FIG. 1, if there are additional voltage sources, then the data bus lines 80 and 85 would be operatively coupled to the circuits associated with those additional voltage sources in addition to the circuits 60 and 65. FIG. 2 shows the data bus lines 80 and 85 directly connected between circuits 60 and 65. This connection is merely illustrative. The data bus lines could be coupled to the circuits such as 60 and 65 via intermediate circuits and/or devices.

The data bus lines in circuits 60 and 65 respectively include data bus segments 70 and 75. As noted with respect to FIG. 1, the data bus and data bus segments do not need to be differential. They can be single ended or any other signal bus suitable for an application. In FIG. 2, the data bus segment 70 includes transistors Q32 and Q33. Transistors Q30 and Q31 in FIG. 2 receive an input signal, IN1. The input signal, IN1 can be from the circuitry associated with voltage source 40 and would have a voltage that varies between the positive and negative voltages of the voltage source 40. For the circuit 65, the input signal IN2 would be from the circuitry associated with voltage source 45 and would have a voltage that varies between the positive and negative voltages of the voltage source 45.

In FIG. 2, a pair of resistors, R33 and R34 sense differential current in the data bus lines 50 and 55. The sensed current controls transistors Q38 and Q39, which provide an output signal. When it is important to send data from the circuitry associated with voltage source 40, the input leads to transistors Q30 and Q31 are pulled down to cause current to flow through resistor R32. The current flows through either transistor Q30 or Q31 depending upon which transistor has its input lead pulled down further. Thus the current through R32 is steered to either resistor R33 or R34 which in turn turns on either transistor Q38 or Q39 respectively. Thus the voltages at the outputs of Q38 and Q39 are responsive to the voltages at the inputs to transistors Q30 and Q31. In like manner, when it is important to send data from the circuitry associated with voltage source 45, the input leads to transistors Q34 and Q35 are pulled down to cause current to flow through resistor R37. This current flows through either transistor Q34 or Q35 depending upon which transistor has its input lead pulled down further. Thus the current through R37 is steered to either resistor R33 or R34 which in turn turns on either transistor Q38 or Q39 respectively. Thus the voltages at the outputs of Q38 or Q39 are responsive to the voltages at the inputs to transistors Q34 and Q35.

It is important, of course, to make sure that the circuits of voltage source 40 do not try to send a signal at the same time as the circuits of voltage source 45 make an attempt. Signals from circuits associated with voltage sources located above voltage source 45 have similar restriction. There are many ways know to people skilled in the art of data communications to deal with bus contention issues. One obvious way is to organize the entire data communications system as a master talking with several slaves. The circuitry of FIG. 1 is used to request data from one of the several slaves associated with the several voltage sources, and only the addressed slave returns data on the circuitry of FIG. 2.

In the FIG. 1 and FIG. 2 circuits, the data source 60 can send serial data in accordance with any protocol suitable for an application. A protocol could be as simple as a two state signal—one state selects circuitry associated with voltage source 10 and the other state selects circuitry associated with voltage source 15. To conserve power the transistors would be switched on when conductive and off when not conductive. The variations discussed with respect to FIG. 1 also apply to FIG. 2.

What is claimed is:

1. A circuit structure operatively connectable to a voltage source, comprising: a signal bus segment including at least one circuit element and operatively connectable to receive a first signal; and a circuit operatively connectable to the voltage source, and operatively connected to corresponding ones of the circuit elements and to provide an output signal responsive to the first signal, wherein the signal bus segment includes at least a pair of signal lines; and the at least one circuit element includes differential circuits operatively connected in series with respective ones of the signal lines.

2. A circuit structure according to claim 1, wherein the circuit includes a differential circuit.

3. A circuit structure operatively connectable to a voltage source, comprising: a signal bus segment including at least one circuit element and operatively connected to provide an output signal; and a circuit operatively connectable to the voltage source and to receive an input signal, and operatively connected to the at least one circuit element so that the output signal is responsive to the input signal, wherein the signal bus segment comprises at least a pair of signal lines; and the at least one circuit element includes differential circuits operatively connected in series with respective ones of the signal lines.

4. A circuit structure according to claim 3, wherein the circuit includes a different circuit.

* * * * *